(12) United States Patent
Puma

(10) Patent No.: US 7,554,472 B2
(45) Date of Patent: Jun. 30, 2009

(54) SIGMA-DELTA MODULATOR

(76) Inventor: Giuseppe Li Puma, Zechenstr. 27, Bochum (DE) 44791

( * ) Notice: Subject to any disclaimer, the term of this patent is extended or adjusted under 35 U.S.C. 154(b) by 7 days.

(21) Appl. No.: 11/838,828

(22) Filed: Aug. 14, 2007

(65) Prior Publication Data

US 2008/0042886 A1 Feb. 21, 2008

(51) Int. Cl.
*H03M 3/00* (2006.01)
(52) U.S. Cl. .................... 341/143; 341/144
(58) Field of Classification Search .......... 341/143, 341/144, 150, 155, 118, 200, 120
See application file for complete search history.

(56) References Cited

U.S. PATENT DOCUMENTS

| | | | |
|---|---|---|---|
| 5,936,562 A * | 8/1999 | Brooks et al. | 341/143 |
| 7,355,541 B2 * | 4/2008 | Schwoerer | 341/144 |
| 2005/0225463 A1 | 10/2005 | Rezeq et al. | |
| 2006/0038710 A1 | 2/2006 | Staszewski et al. | |
| 2006/0119493 A1 | 6/2006 | Tal et al. | |
| 2006/0290550 A1 * | 12/2006 | Lee | 341/144 |

OTHER PUBLICATIONS

Norsworthy, Steven R. et al., "Delta-Sigma Data Converters", IEEE Press 1997, Book, ISBN 0-7803-1045-4.
Riley, Tom A. D. et al., "Delta-Sigma Modulation in Fractional-N Frequency Synthesis" IEEE Journal of Solid-State Circuits, vol. 28, No. 5, May 5, 1993, pp. 553-559.
Vaidyanathan, P. P., "Multirate Digital Filters, Filter Banks, Polyphase Networks, and Applications: A Tutorial", Proceedings of the IEEE, vol. 78, No. 1, Jan. 1990.

* cited by examiner

*Primary Examiner*—Rexford Barnie
*Assistant Examiner*—Joseph Lauture
(74) *Attorney, Agent, or Firm*—Lee & Hayes, PLLC

(57) ABSTRACT

A sigma-delta modulator arrangement is disclosed that has a mechanism for breaking down a data word of the input signal into subwords with a different significance. The disclosed sigma-delta modulator arrangement also has a plurality of sigma-delta modulators whose inputs are assigned to respective subwords of the input signal.

27 Claims, 9 Drawing Sheets

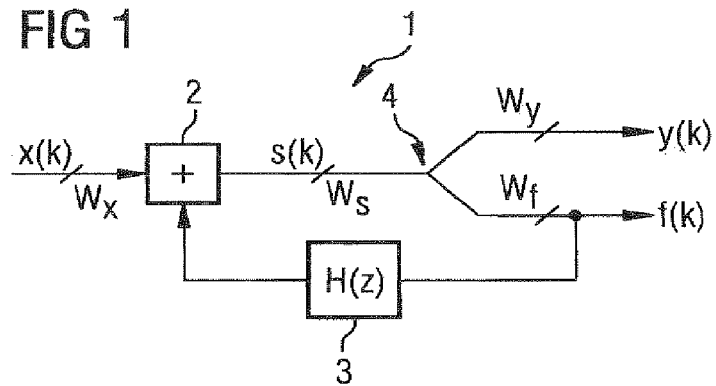
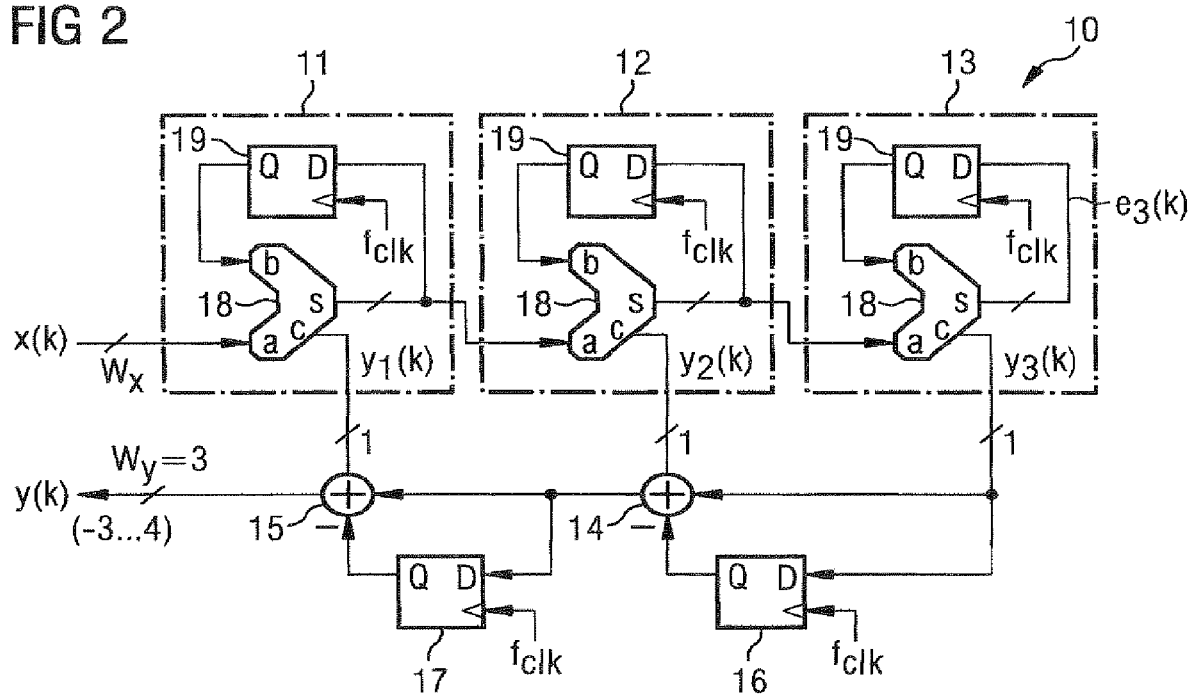

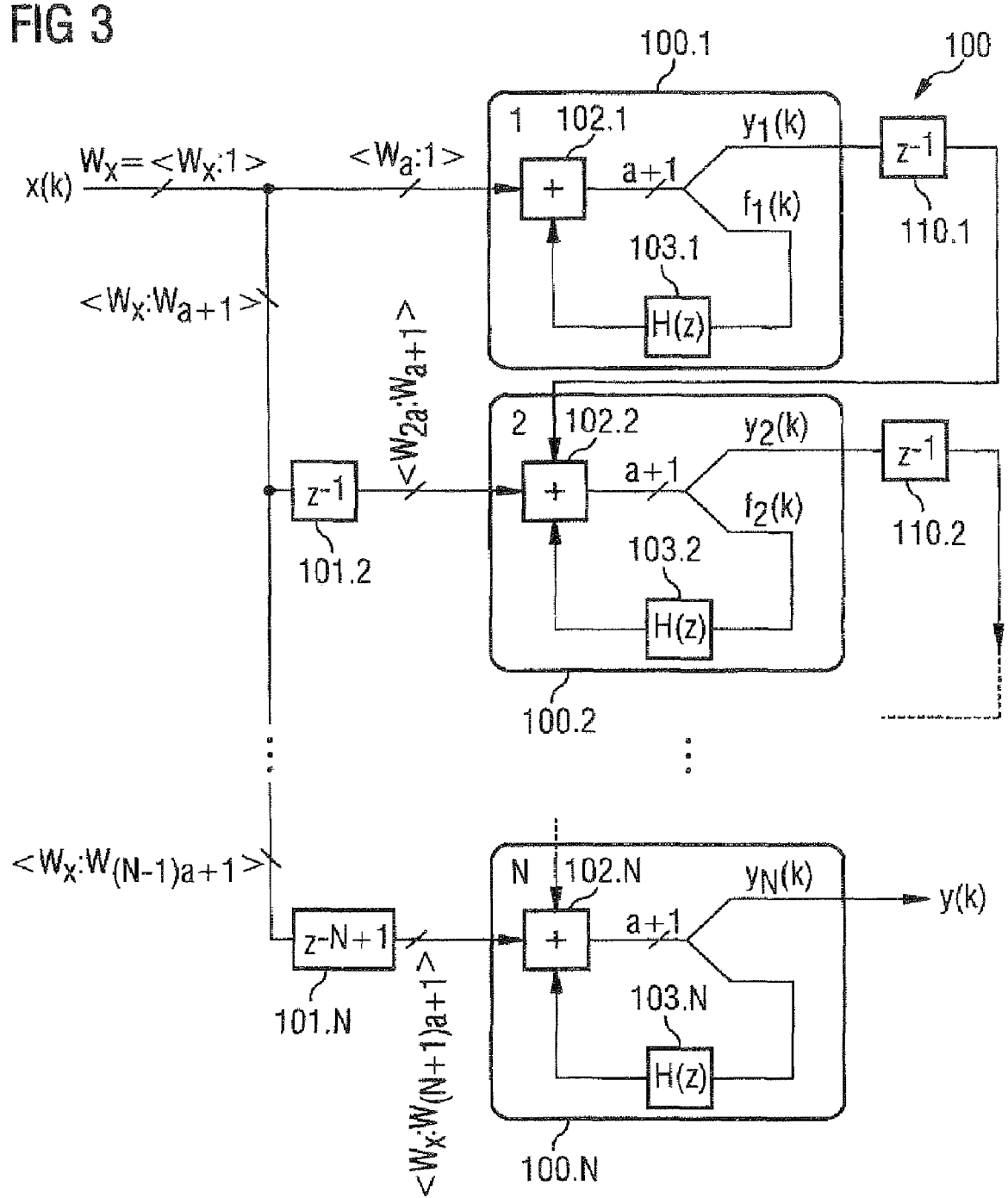

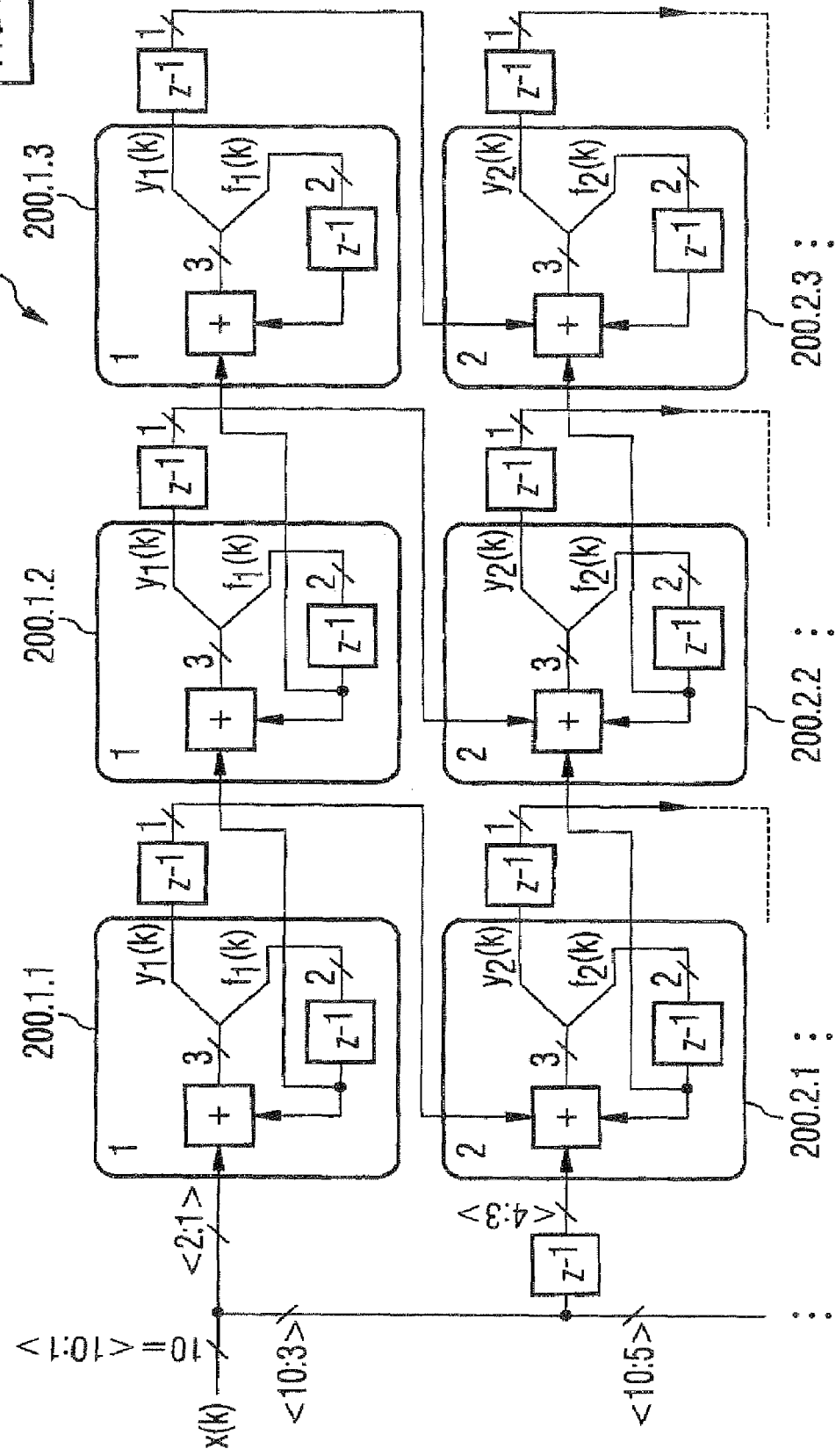

SIGMA-DELTA MODULATOR

CROSS-REFERENCE TO RELATED APPLICATION

This application claims priority under 35 USC Section 119 to German Patent Application No. 10 2006 038 020.7, filed on Aug. 14, 2006 and titled "Sigma-Delta Modulator," the entire contents of which are hereby incorporated by reference.

BACKGROUND

Sigma-delta modulators (SDM) are used in many different areas of technology. They have become particularly important in the analog/digital and digital/analog conversion of electrical signals. Another typical area in which SDMs are used is in phase feedback loops, so-called PLLs (phase-locked loop), in which SDMs are used, for example, as phase frequency detectors (PFD) or to generate a high-resolution fractional modulation signal.

As the speed of integrated circuits increases, SDMs are becoming interesting for radio-frequency applications. "Fast" SDMs with short internal signal propagation times are needed for radio-frequency applications.

BRIEF DESCRIPTION OF THE DRAWINGS

The present disclosure will be explained below using exemplary implementations and with reference to the figures, in which:

FIG. 1 shows a functional illustration of an SDM in the form of a general block diagram;

FIG. 2 shows a circuit diagram of a third-order MASH SDM;

FIG. 3 shows a general block diagram of one exemplary implementation of the present disclosure;

DETAILED DESCRIPTION

Figure 4:
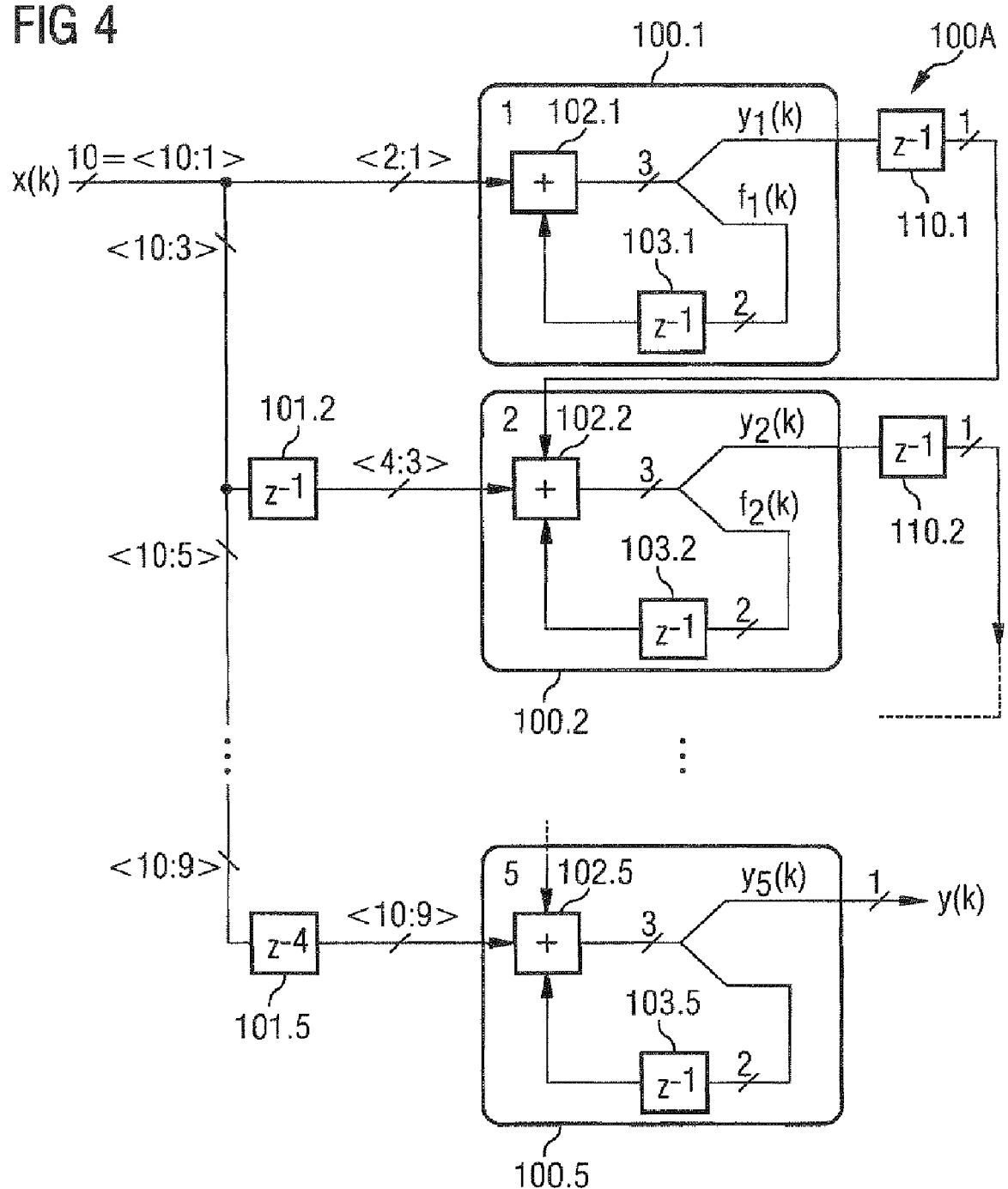
FIG. 4 shows a first example of a circuit diagram of a sigma-delta modulator arrangement according to FIG. 3.

The present disclosure relates to a sigma-delta modulator (SDM) arrangement and to a method for sigma-delta modulation of a digital signal. The present disclosure also relates to a modulator of a radio-frequency transmitter that includes a sigma-delta modulator arrangement. Moreover, a sigma-delta arrangement, a method for sigma-delta modulation of a digital input signal, and a radio-frequency transmitter are disclosed that are each suitable for a high-speed application.

According to one implementation, a sigma-delta modulator arrangement has a mechanism that breaks down a data word of the input signal into subwords with a different significance. The sigma-delta modulator arrangement has a plurality of SDMs whose inputs are assigned to respective subwords of the input signal. An output signal from a first SDM is fed into a second SDM. Splitting up the input signal into a plurality of subwords results in each SDM in the sigma-delta modulator arrangement having to process only one partial signal with a reduced word length. Consequently, the processing speed of the sigma-delta modulator arrangement can be increased.

The SDMs may be of the same order or of a different order. The transfer functions in the quantization error feedback paths of the individual SDMs may also be identical or different. The subwords may have the same word length or different word lengths. For their part, the SDMs may be constructed from a plurality of serially concatenated SDMs, that is to say may have a so-called MASH (Multi Stage Noise Shaping) architecture. Overall, there are a multiplicity of possible implementations which allow an inventive sigma-delta modulator arrangement to be provided, said arrangement having any desired noise transfer function and being able to operate at high clock frequencies (that is to say with high oversampling).

The method of operation of an SDM involves first of all roughly measuring (quantizing) a signal and continuously compensating for the measurement error produced in the process using negative feedback.

FIG. 1 illustrates the method of operation of a digital SDM in a general block diagram. The SDM 1 receives a digital input signal x(k) with the word length Wx at an adder 2. The second input of the adder 2 is connected to a feedback loop in which a processing stage 3 with the transfer function H(z) is situated. The output signal s(k) from the adder 2 is broken down, at 4, into a signal y(k) of more significant bits with the word length Wy and a signal f(k) of less significant bits with the word length Wf. Ws=Wy+Wf, where Ws denotes the word length of the signal s(k). y(k) is the output signal from the SDM 1. It is a representation of the input signal x(k) with a reduced word length, that is to say Wy<<Wx. The signal f(k) represents the quantization error, that is to say the difference between the input signal x(k) and the output signal y(k). It is fed into the feedback loop and is passed to the adder 2 after passing through the processing stage 3.

The SDM 1 is operated at a clock rate which is typically considerably higher than the data rate of the input signal x(k). That is to say the input signal x(k) can be considered to be quasi-static. Therefore, the SDM 1 can also be understood as being an interpolator which provides, at its output y(k), a representation of the digital input signal x(k) with a relatively low bit resolution. As a result of the fact that the input signal x(k) is oversampled, noise components in the input signal are shifted into higher frequency ranges (so-called "noise shaping"), thus increasing the signal-to-noise ratio in the output signal y(k) in the useful frequency range.

The word length Wy of the output signal y(k) corresponds to the order of the SDM 1 which is determined by the transfer function H(z). For example, a third-order SDM has a word length of Wy=3 of the output signal y(k).

The SDM illustrated in FIG. 1 can be described by the equation:

$$Y(z)=X(z)+E(z)(1-H(z)) \qquad (1)$$

X(z) is the Z transform of the input signal x(k), Y(z) is the Z transform of the output signal y(k) and E(z) indicates the Z transform of the quantization error. The term (1−H(z)) is referred to as the noise transfer function (NTF) of the SDM.

FIG. 1 is universally valid since any SDM can be illustrated in this manner. If the input signal x is an analogue signal x(t), it is quantized using a sampling stage in the adder 2.

SDMs with a different architecture can be realized on the basis of the general functional structure illustrated in FIG. 1. FIG. 2 shows, by way of example, an SDM with a MASH architecture. Such MASH SDMs are produced by cascading individual SDMs of a typically low order.

FIG. 2 shows a third-order MASH SDM 10. The MASH SDM 10 comprises three cascaded first-order SDMs 11, 12, 13. The MASH SDM 10 also has two adders 14, 15 and two flip-flops 16, 17 for generating the output signal y(k).

In this example, each SDM 11, 12, 13 is in the form of an accumulator with a carry adder 18 and a flip-flop 19 in the feedback path between the summation output s of the carry adder 18 and an adder input b of the carry adder 18. The input signal x(k) with the word length Wx is passed to a first input a of the transmission adder 18 of the first SDM 11. The summation output s of the transmission adder 18 corresponds—based on the SDM 11—to the signal f(k) in FIG. 1 and is supplied, via the flip-flop 19 (corresponds to the processing stage 3 with H(z)=z−1 in FIG. 1), to the second input b of the carry adder 18 (corresponds to the adder 2 in FIG. 1). The clock frequency $f_{clk}$ at the flip-flop 19 is the clock frequency of the SDM 11 and is greater than the data rate of the input signal x(k).

It is clear from FIG. 2 that the quantization error signal of the SDM 11 at the output s of the carry adder 18 is used as an input signal for the next SDM 12 and is subjected to noise shaping there. The same applies to the quantization error signal of the SDM 12, which is passed to the input of the SDM 13.

The output signals from the SDMs 11, 12, 13, which have been subjected to noise shaping and are present at the carry outputs c of the carry adders 18, have the word length 1 and are combined in a suitable manner using the adders 14, 15 and the flip-flops 16, 17 in order to produce an output signal y(k) in the range of values −3, . . . , +4 and having a word length of Wy=3.

Based on the general structure of an SDM that is illustrated in FIG. 1, the MASH SDM 10 shown in FIG. 2 can be mathematically described in the following manner:

$$Y(z) = Y_1(z) + Y_2(z)(1-z^{-1}) + Y_3(z)(1-z^{-1})^2 \quad (2)$$
$$= Y_1(z) + Y_2(z)(1-z^{-1}) + Y_3(z)(1-2z^{-1}+z^{-2})$$
$$= X(z) + E_3(z)(1-z^{-1})^3$$

where $Y_1(z)$, $Y_2(z)$, $Y_3(z)$ denote the Z transforms of the output signals $y_1(k)$, $y_2(k)$, $y_3(k)$ from the SDMs 11, 12, 13 and $E_3(z)$ denotes the Z transform of the quantization error signal $e_3(k)$ of the SDM 13. A comparison with equation (1) shows that the third-order MASH SDM 10 has the noise transfer function $(1-z^{-1})^3$.

It is pointed out that MASH SDMs may be designed in a variety of different ways. For example, the number, order and noise transfer function of cascaded SDMs as well as the circuit for combining the output signals from the individual SDMs may be designed differently.

The maximum clock frequency of the MASH SDM 10 is determined by the length of the critical path. The latter extends through all of the SDMs 11, 12, 13 and through the circuit 14, 15, 16, 17 for generating the output signal y(k). The signal propagation time in the MASH SDM 10 is $$\tau_{del} = m\tau_{acc} + (m-1)\tau_{add} \quad (3)$$

where $\tau_{acc}$ denotes the signal delay in the accumulators 18, $\tau_{add}$ denotes the signal delay in the adders 14, 15 and $\tau_{del}$ specifies the total signal propagation time through the MASH SDM 10. m denotes the order of the MASH SDM 10 and m=3 in the example illustrated in FIG. 2.

On account of the long input word length Wx>>1, the signal propagation time $\tau_{acc}$ of the accumulator 18 is typically considerably longer than the signal propagation time $\tau_{add}$ in the adders 14, 15. The oversampling rate and thus the resolution of the MASH SDM 10 are therefore determined by the computation speed of the accumulators 18.

FIG. 3 illustrates one exemplary implementation of an SDM modulator architecture according to the present disclosure. The input signal x(k) with the word length Wx is split into N subwords XNB, . . . , X2B, X1B. In general, the subwords may have different word lengths. The following expression results for an identical word length Wa of the subwords XNB, . . . , X2B, X1B:

$$X_B = b_{Wx-1} \ldots b_{Wa+1} b_{Wa} b_{Wa-1} \ldots b_1 b_0 \quad (4)$$
$$= \underbrace{b_{Wx-1} \ldots b_{W(N-1)a}}_{X_{N_B}} \ldots \underbrace{b_{W2a-1} \ldots b_{Wa}}_{X_{2_B}} \underbrace{b_{Wa-1} \ldots b_0}_{X_{1_B}}$$

The SDM 100 comprises N SDMs 100.1, 100.2, . . . , 100.N. Each of these SDMs is illustrated in the form of the SDM 1 of FIG. 1, that is to say may have any desired design and/or any desired architecture. For example, the SDMs 100.1, 100.2, . . . , 100.N may be of the first order or a higher order, they may be of an identical or different order, they may have the same or different noise transfer functions, they may have any desired architecture, for example in the form of MASH SDMs according to the MASH SDM 10, etc. However, it is important for only one subword $X_{NB}$, . . . , $X_{2B}$, $X_{1B}$ of the input signal x(k) to be respectively passed to their inputs.

As can be gathered from FIG. 3, the output signal y1(k) from the first SDM 100.1 is passed to the input-side adder 102.2 of the second SDM 100.2 via a delay stage 110.1 (for example a flip-flop). In comparison with the adder 102.1 of the first SDM 100.1, the adder 102.2 has a further adder input for this purpose. The operation of feeding output signals yn(k) from the SDMS 100.n back into the input-side adders 102.n+1 of the next SDM 100.n+1 via output-side delay stages 110.n is continued through the entire structure for n=1, 2, . . . , N−1. The last SDM 100.N provides the output signal y(k) of the SDM 100 at its output yN(k). A delay stage 101.n with a delay of z−n+1 is connected upstream of the input of each SDM 100.n, where n>1. The delay stages 110.n on the output side cause the output signal yn(k), which is passed to the next SDM 100.n+1 by the preceding SDM 100.n, to arrive at the correct time with the input signal of the SDM 100.n+1. The processing stages in feedback loops are denoted using the reference symbols 103.n, n=1, . . . , N.

In an analogous manner to the architecture of polyphase filters that is known in digital electronics, the sigma-delta modulator arrangement in which the SDMs are driven using subwords can also be referred to as a polyphase SDM 100. In this case, N specifies the number of polyphases.

Figure 5:
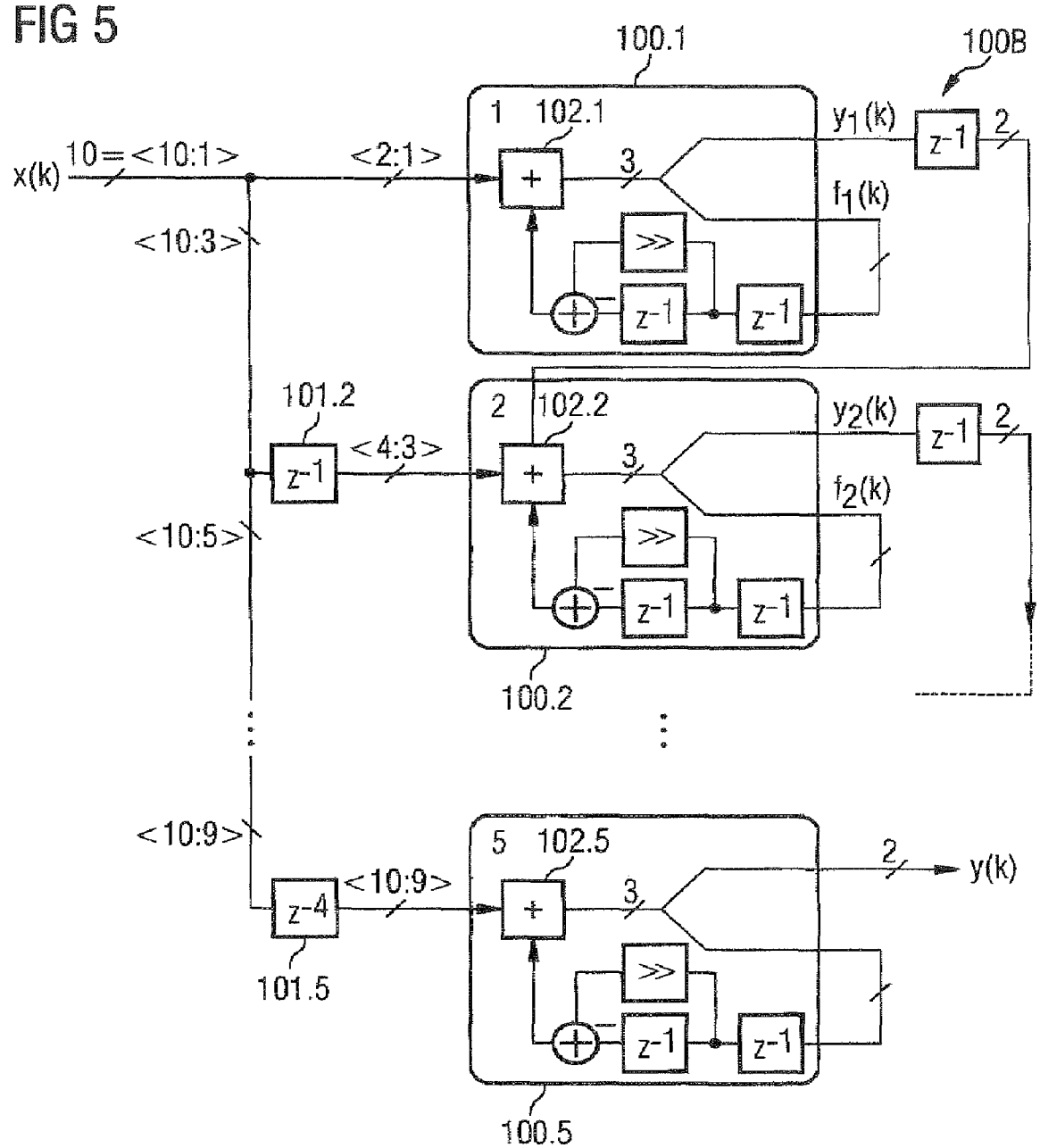
FIG. 5 shows a second example of a circuit diagram of a sigma-delta modulator arrangement according to FIG. 3.

FIGS. 4 and 5 show two possible specific implementations of the exemplary implementation illustrated in FIG. 3. Components or subassemblies that correspond to one another are denoted using the same reference symbols. In FIG. 4, the input words with a word length of Wx=10 are subdivided into subwords each with the word length Wa=2. A first-order SDM 100.n, n=1, . . . , 5, is assigned to each subword. In this case, the transfer function of the processing stages 103.n in the feedback paths is given by H(z)=z−1 and may be realized using a flip-flop. The entire sigma-delta modulator arrangement 100A likewise has the order 1.

It is pointed out that the delay stages 103.n in the feedback loops can also be moved into the signal path downstream of the output of the adders 102.n. In this case, the delay stages 110.n at the outputs of the SDMs 100.n are dispensed with since the signal inside the individual SDMs 100.n has already been delayed by one clock pulse.

FIG. 5 shows, as another possible implementation, a second-order sigma-delta modulator arrangement 100B with the general architecture illustrated in FIG. 3. As in the circuit illustrated in FIG. 4, the data words of the input signal with the word length Wx=10 of the input signal x(k) are broken down into subwords with the word length Wa=2. In contrast to the sigma-delta modulator arrangement 100A illustrated in FIG. 4, the individual SDMs 100.n are of the second order and have the transfer function $H(z)=2z-1-z-2$ for this purpose. As is clear from FIG. 5, the processing stages 103.n are constructed, for this purpose, from two flip-flops, an adder and a shift register for multiplying by the factor 2. The output signals xn(k) from the SDMs 100.n have the word length Wy=2.

Any desired noise transfer function can be realized by selecting a suitable transfer function H(z). For example, the transfer function $H(z)=3z-1-3z-2+z-3$ is of practical importance for third-order noise shaping using the noise transfer function $NTF=1-H(z)=(1-z-1)3$. As can be seen from the noise transfer function, this function has a triple zero point for $z0=e^{j\omega_0 T}$, where $\omega_0=0$. Noise transfer functions having zero points which are distributed in an arbitrary manner in the s plane can be realized by means of a suitable selection of H(z), with the result that NTF(z) can generally be expressed as:

$$NTF(z) = 1 - H(z) = 1 - \prod_{i}^{N}(z - z_i)$$

However, only simple operations, for example addition or digit shifting, are advisable for high-speed applications in order to avoid impairing the high speed of the SDMs 100.n.

Figures 6, 6A:
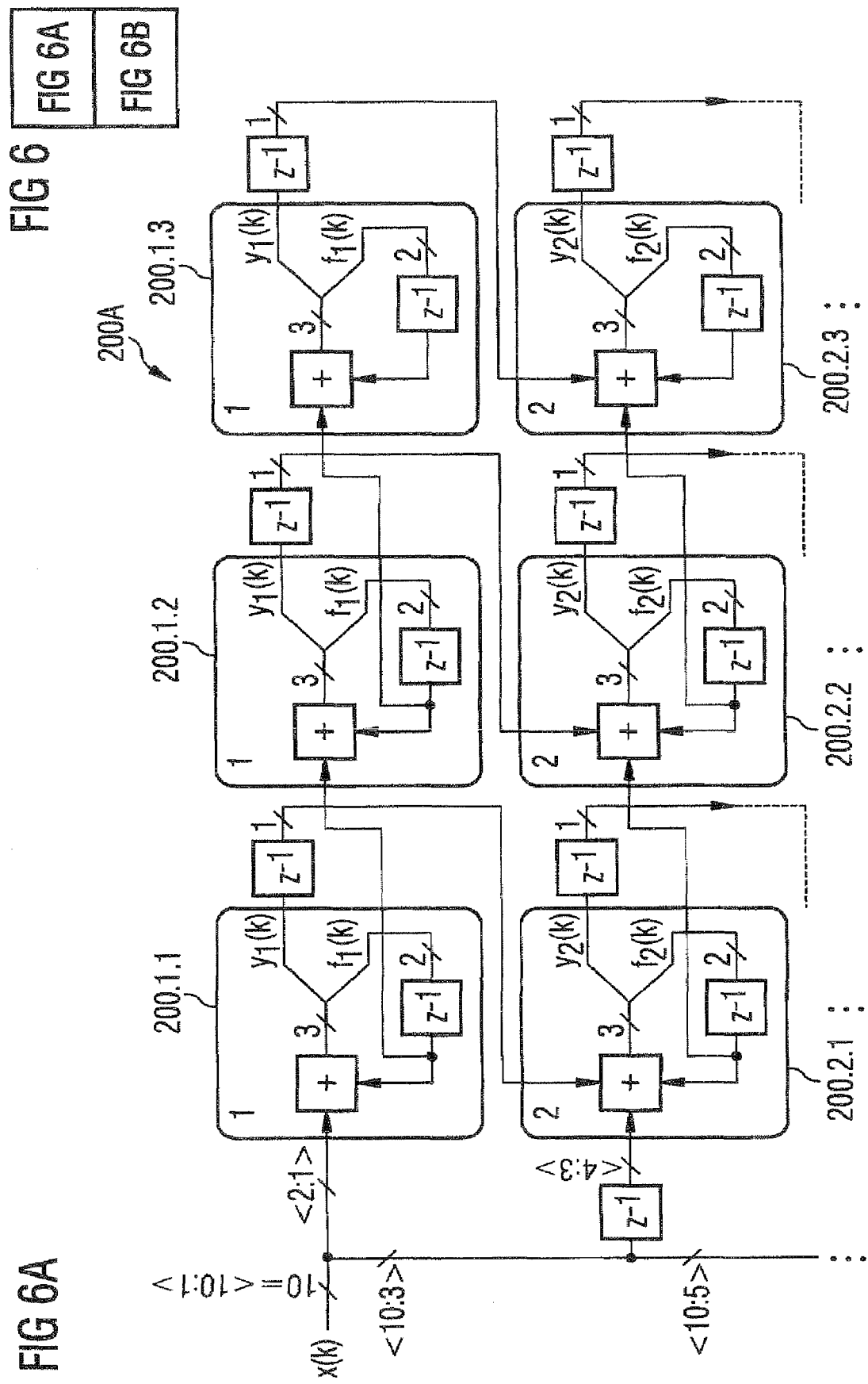
FIG. 6 shows a general block diagram of a further exemplary implementation of the present disclosure.
Figure 6B:
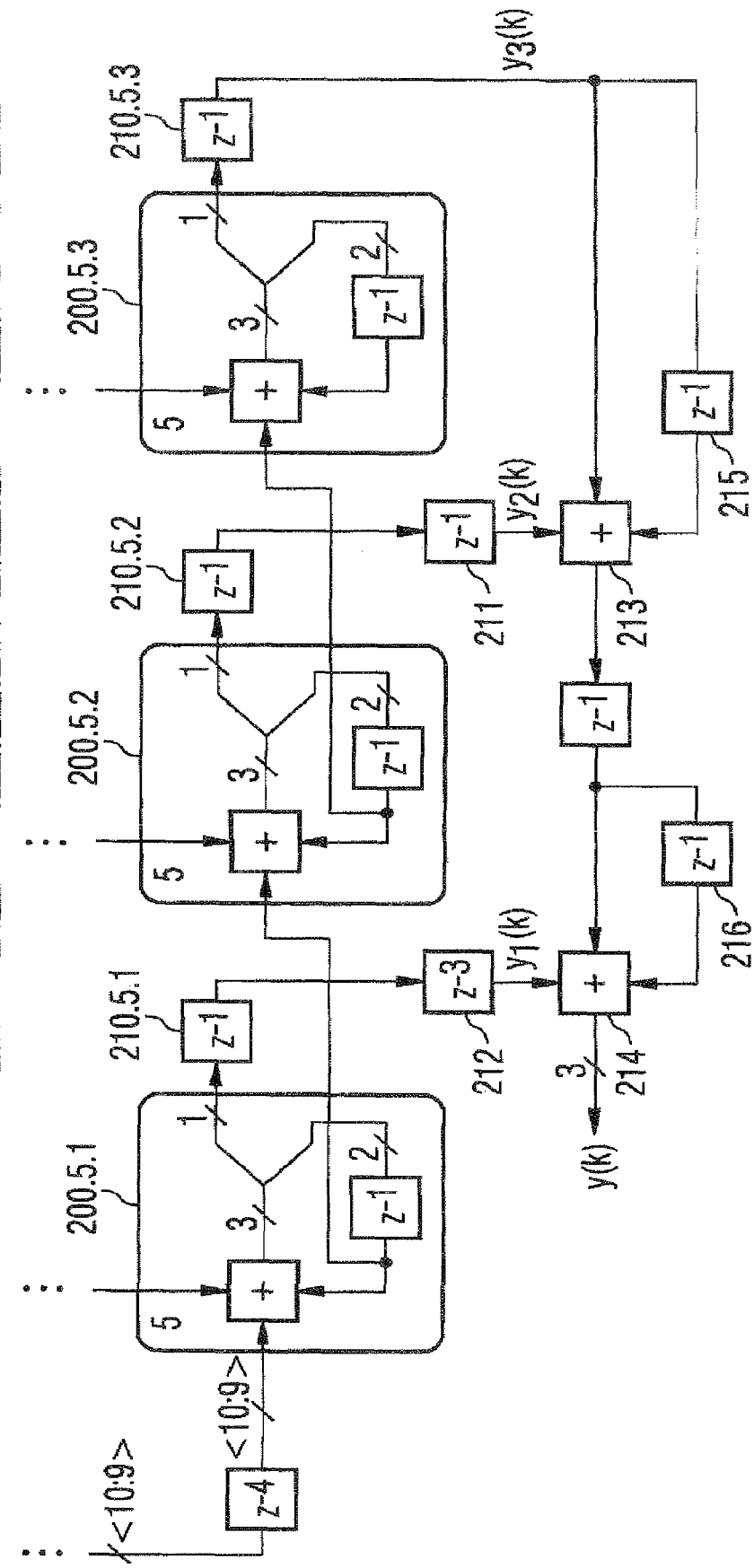
Figure 7B:
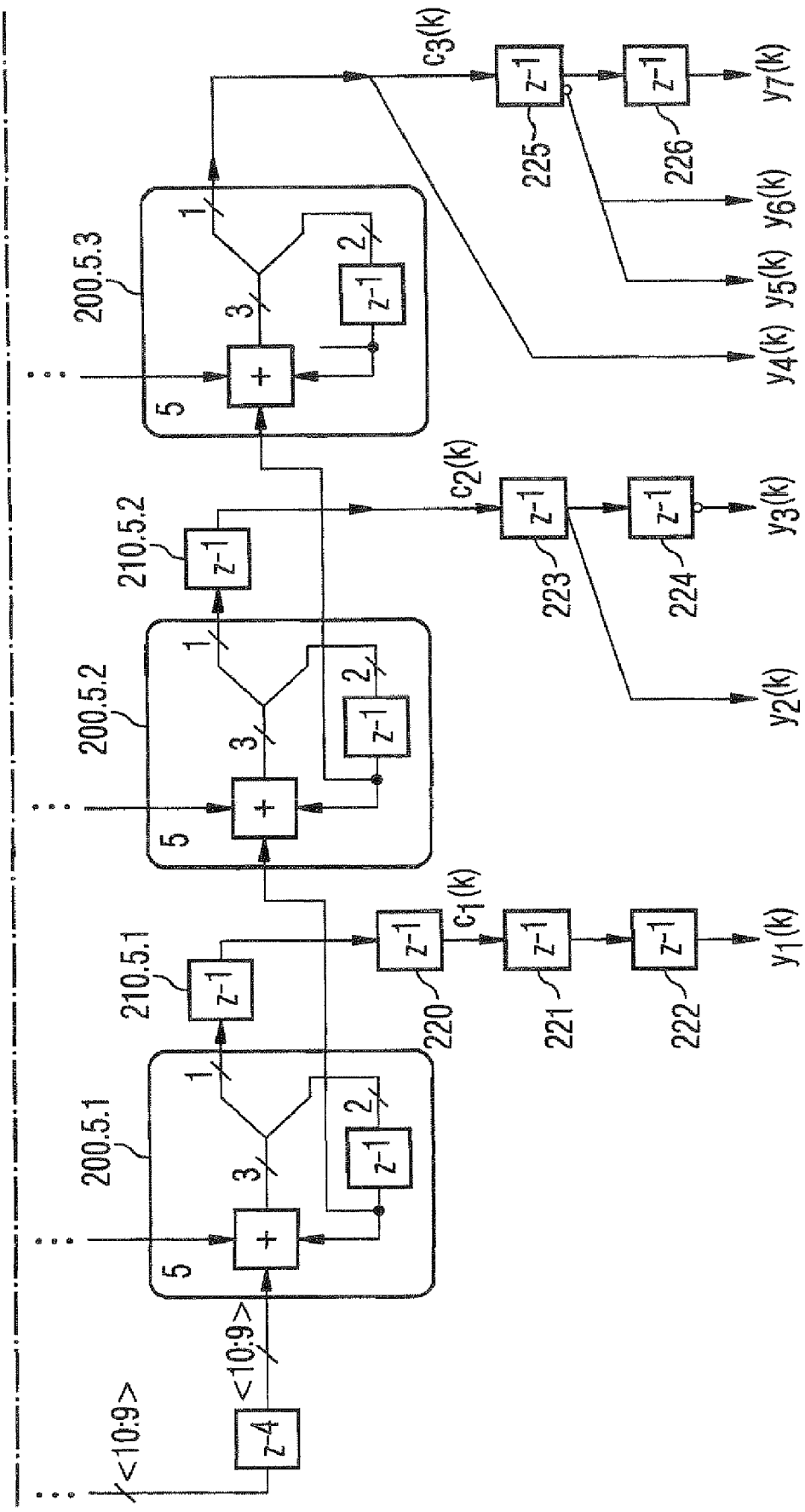
FIG. 7 shows a general block diagram of a variant of the further exemplary implementation illustrated in FIG. 6.

FIGS. 6 and 7 show other possible architectures of sigma-delta modulator arrangements, in which the individual SDMs are arranged in an array that is connected in the manner of MASH structures. The sigma-delta modulator arrangements described below are again illustrated for the special case of N=5, Wx=10 and Wa=2. Just like the exemplary implementations above, they can be generalized with regard to any desired word lengths Wx, any desired and different subword lengths Wa, any desired and different noise transfer functions of the individual SDMs, any desired and different implementations of the individual SDMs etc.

FIG. 6 shows a first MASH sigma-delta modulator arrangement 200A which is constructed from an array of first-order SDMs 200.n.m, where n=1, ..., 5, m=1, 2, 3. In the example selected here, the structure of the individual SDMs 200.n.m is identical to the structure of the SDMs 100.n in FIG. 4. The connection of SDMs 200.n.m in each column m of the SDM array is likewise identical to that in the illustration in FIG. 4. The SDMs 200.n.m arranged in each row n of the SDM array are in the form of a MASH structure, see FIG. 2. The row-based MASH structure, which is illustrated in FIG. 6 and respectively comprises three SDMs 200.n.m, differs from the MASH structure illustrated in FIG. 2 in terms of the connection of the individual SDMs 200.n.m only by virtue of the fact that the input signal of a downstream SDM 200.n.m+1 is tapped off downstream of the delay stage 19 rather than upstream of the latter as in FIG. 2. The design shown in FIG. 2 is likewise possible, however.

The output signal y(k) from the MASH sigma-delta modulator arrangement 200A is generated from the output signals from the SDMs 200.5.m in the lowermost row of the SDM array. For this purpose, the output signal from the SDM 200.5.3 is delayed once using the delay stage 210.5.3, the output signal from the SDM 200.5.2 is delayed twice using the delay stages 210.5.2 and 211, and the output signal from the SDM 200.5.1 is delayed four times using the delay stages 210.5.1 and 212. The signals y3(k), y2(k) and y1(k) generated in the process are then combined in a suitable manner using adders 213, 214 and further delay stages 215, 216, with the result that the output signal y(k) with the bit width Wy=3 is produced at the output of the adder 214.

FIG. 7 shows another MASH sigma-delta modulator arrangement 200B, which differs from the modulator arrangement 200A illustrated in FIG. 6 only by virtue of the fact that a set of, for example, seven output signals yi(k), i=1, ..., 7, is provided rather than an individual output signal y(k). The number of output signals depends on the application. For example, the output signals yi(k) may be intended to switch a capacitance array or the like. The output signal y1(k) can be generated by delaying the output signal from the SDM 200.5.1 using the delay stage 210.5.1 and three further delay stages 220, 221, 222 and weighting it with the factor c1(k). The output signals y2(k) and y3(k) are generated, after being delayed in the delay stage 210.5.2, by weighting them with the factor c2(k) and delaying them further in the delay stage 223 in order to obtain the signal y2(k) and delaying the signal again in the delay stage 224 in order to obtain the output signal y3(k). The output signal y4(k) is the output signal from the SDM 200.5.3. The output signals y5(k), y6(k) and y7(k) are produced, after the output signal from the SDM 200.5.3 has been weighted with the factor c3(k), by delaying said signal twice in the delay stages 225, 226 (y7(k)) or by inverting the signal output at the delay stage 225 (identical signals y5(k), y6(k)).

Both the MASH sigma-delta modulator arrangement 200A in FIG. 6 with traditional addition of the individual transmission values in order to generate the output signal y(k) and the MASH sigma-delta modulator arrangement 200B, which is illustrated in FIG. 7 and is intended to directly drive switching-on elements (transistors, capacitances etc.), are implementations of a third-order MASH 1-1-1 SDM. Any desired MASH structures, e.g., a fourth-order MASH 2-1-1 SDM structure (in this case, the SDMs 200.n.1 in the first column would be second-order SDMs), can be realized. MASH structures in which quantization error signals are fed back via a plurality of SDMs are also possible. All of the implementations result in the advantage that, on account of the reduced input word length, a higher clock speed is enabled for each SDM without requiring an increased amount of space (that is to say a larger chip area) for the "entire" input signal x(k) in comparison with the conventional architecture with SDMs. Apart from the fact that the input signal is split into subwords, the rest of the design of the sigma-delta modulator arrangement can be freely varied and can therefore be selected according to the desired area of use. In particular, the exemplary implementations explained in FIGS. 1 to 7 can be combined with one another.

Figure 8:
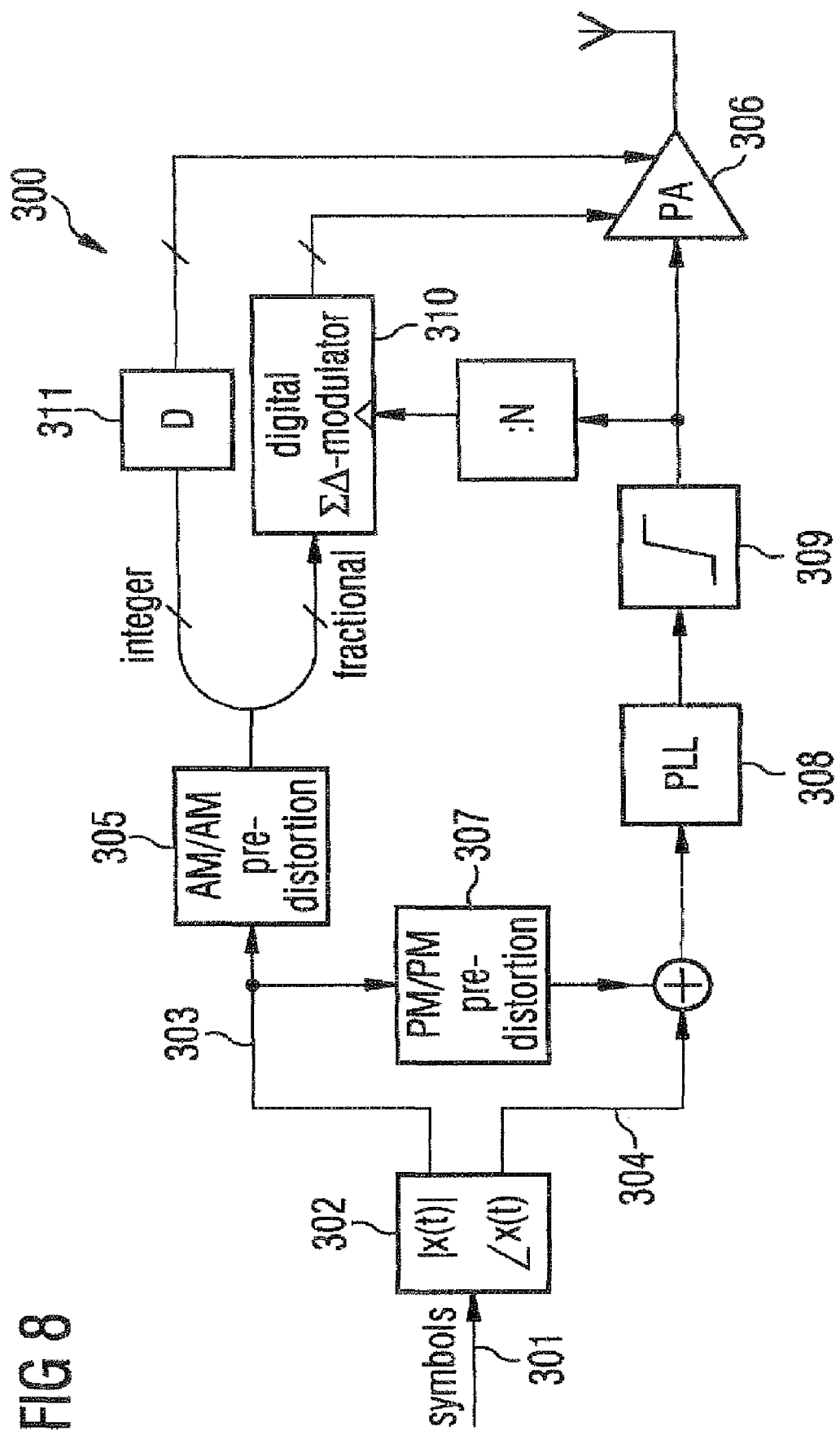
FIG. 8 shows a block diagram of a modulator in a radio-frequency transmission circuit.

FIG. 8 shows a simplified block diagram of a digital radio-frequency transmitter 300 in which an SDM 310 is used. The transmitter 300 receives a digital data signal 301 comprising data symbols which are intended to be transmitted to a receiver via an air interface. For this purpose, the data signal 301 is first of all split into a magnitude signal 303 and a phase signal 304 in a data processing unit 302. The magnitude signal 303 is predistorted in an amplitude predistorter 305 according to the non-linear characteristic of a power amplifier PA 306 used for signal emission. The amplitude predistortion is carried out in the baseband and can be carried out using a look-up table, for example. The non-linear characteristic of the power amplifier 306 is taken into account with regard to the phase distortion and is added to the phase signal 304 as an additive contribution in a pulse modulation predistorter 307. A PLL 308 whose output signal is passed to the power amplifier 306 as an input signal after signal shaping in the stage 309 is used in a known manner for the phase modulation.

The digital amplitude information present at the output of the amplitude predistorter 305 is transferred to the carrier frequency in the form of direct amplitude modulation by selectively switching transistors in a transistor array on and off in the power amplifier 306. For this purpose, the output signal from the amplitude predistorter 305 is split into an integer component and a fractional component. The fractional component is passed to the digital SDM 310. The digital SDM 310 is used as an interpolator and operates at a high clock frequency in order to modulate the envelope of the emitted signal according to the fractional amplitude information with a high amplitude resolution. The integer component of the amplitude information is delayed in a delay stage 311 in order to compensate for the signal processing duration in the SDM 310.

For GSM (Global System for Mobile Communications) applications, the SDM 310 can be operated at a clock rate of 900 MHz, for example, in order to meet the GSM/EDGE (Enhanced Data Services for GSM Evolution) requirements imposed on the spectral mask.

The invention claimed is:

1. A sigma-delta modulator arrangement comprising:
    a mechanism for breaking down a data word of the input signal into subwords with a different significance, and
    a plurality of sigma-delta modulators whose inputs are assigned to respective subwords of the input signal,
        a particular subword being assigned to an input of a first sigma-delta modulator,
        the subword with a next higher significance being assigned to an input of a second sigma-delta modulator, and
        an output signal from the first sigma-delta modulator being injected into the second sigma-delta modulator.

2. A sigma-delta modulator arrangement according to claim 1, wherein the output signal from the first sigma-delta modulator is superimposed on the quantization error signal in the second sigma-delta modulator.

3. A sigma-delta modulator arrangement according to claim 1, wherein all of the sigma-delta modulators are of the same order.

4. A sigma-delta modulator arrangement according to claim 1, wherein at least two sigma-delta modulators are of a different order.

5. A sigma-delta modulator arrangement according to claim 1, wherein all of the sigma-delta modulators have the same transfer function in the quantization error feedback path.

6. A sigma-delta modulator arrangement according to claim 1, wherein at least two sigma-delta modulators have a different transfer function in the quantization error feedback path.

7. A sigma-delta modulator arrangement according to claim 1, further comprising:
    a particular subword being assigned to the input of a first sigma-delta modulator,
    the subword with the next higher significance being assigned to the input of a second sigma-delta modulator, said arrangement having a delay unit for delaying the input signal of the second sigma-delta modulator in comparison with the input signal of the first sigma-delta modulator.

8. A sigma-delta modulator arrangement according to claim 1, wherein at least one of the sigma-delta modulators is a MASH sigma-delta modulator.

9. A sigma-delta modulator arrangement according to claim 1, wherein the sigma-delta modulator arrangement is a MASH sigma-delta modulator.

10. A sigma-delta modulator arrangement according to claim 1, wherein the subwords have the same word length.

11. A sigma-delta modulator arrangement according to claim 1, wherein the subwords have different word lengths.

12. A sigma-delta modulator arrangement comprising
    a plurality of sigma-delta modulators that are arranged parallel to one another on the input side, each modulator processing subwords with a different significance of an input-side data word,
    an output of a first sigma-delta modulator being injected into a second sigma-delta modulator, which processes a subword with a higher significance than that processed by the first sigma-delta modulator.

13. A sigma-delta modulator arrangement according to claim 12, wherein an M−1 number of further sigma-delta modulators are respectively connected in series downstream of each input-side sigma-delta modulator, where M>1.

14. A sigma-delta modulator arrangement according to claim 13, wherein a signal that is characteristic of the quantization error in an upstream sigma-delta modulator is injected into a downstream sigma-delta modulator.

15. A sigma-delta modulator arrangement according to claim 13, wherein the output signal from a further sigma-delta modulator that is connected downstream of the first sigma-delta modulator is injected into a further sigma-delta modulator which is connected downstream of the second sigma-delta modulator.

16. A sigma-delta modulator arrangement according to claim 12, further comprising an input-side data word having Wx bits and a subword containing Wx/N bits.

17. A method for sigma-delta modulation of a digital input signal comprising:
    breaking down a data word of the input signal into subwords with a different significance;
    assigning data streams to the subwords respectively being subjected to sigma-delta modulation;
    assigning a particular subword to an input of a first sigma-delta modulator;
    assigning the subword with a next higher significance to an input of a second sigma-delta modulator, and
    injecting an output signal from the first sigma-delta modulator into the second sigma-delta modulator.

18. A method according to claim 17, further comprising:
    a first data stream being assigned to a particular subword; and
    a second data stream being assigned to the subword with the next higher significance,
    the first data stream which has been subjected to sigma-delta modulation being taken into account during the sigma-delta modulation of the second data stream.

19. A method according to claim 18, wherein the first data stream that has been subjected to sigma-delta modulation is superimposed on the quantization error signal that occurs during the sigma-delta modulation of the second data stream.

20. A method according to claim 17, further comprising all of the data streams being subjected to sigma-delta modulation of the same order.

21. A method according to claim 17, further comprising at least two data streams being subjected to sigma-delta modulation of a different order.

22. A method according to claim 17, further comprising all of the data streams being subjected to sigma-delta modulation with the same transfer function in the quantization error feedback path.

23. A method according to claim 17, further comprising at least two data streams being subjected to sigma-delta modulation with different transfer functions in the quantization error feedback path.

24. A method according to one of claim 17, further comprising:
   a first data stream being assigned to a particular subword, and
   a second data stream being assigned to the subword with the next higher significance,
   the second data stream being delayed in comparison with the first data stream.

25. A sigma-delta modulator arrangement having an arrangement comprising:
   a plurality of sigma-delta modulators which are arranged parallel to one another on the input side and each process subwords with a different significance of an input-side data word,
   an output of a first sigma-delta modulator being injected into a second sigma-delta modulator which processes a subword with a higher significance than that processed by the first sigma-delta modulator.

26. A sigma-delta modulator arrangement according to claim 25, further comprising an input-side data word having M bits and a subword containing M/N bits.

27. A radio-frequency transmitter having an amplifier for generating a transmission signal, which is driven by a sigma-delta modulator for the purpose of amplitude modulation, the sigma delta modulator comprising a mechanism for breaking down a data word of a fractional input signal into subwords with a different significance and a plurality of sigma-delta modulators whose inputs are assigned to respective subwords of the fractional input signal, a particular subword being assigned to an input of a first sigma-delta modulator, a the subword with a next higher significance being assigned to an input of a second sigma-delta modulator, and an output signal from the first sigma-delta modulator being injected into the second sigma-delta modulator.

* * * * *